(12) United States Patent
Jeong et al.

(10) Patent No.: US 10,461,008 B2
(45) Date of Patent: Oct. 29, 2019

(54) ELECTRONIC COMPONENT PACKAGE HAVING STRESS ALLEVIATION STRUCTURE

(71) Applicant: SAMSUNG ELECTRONICS CO., LTD., Suwon-si (KR)

(72) Inventors: Sung Won Jeong, Suwon-si (KR); Ji Hoon Kim, Suwon-si (KR); Sun Ho Kim, Suwon-si (KR); Shang Hoon Seo, Suwon-si (KR); Seung Yeop Kook, Suwon-si (KR); Christian Romero, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/205,483

(22) Filed: Jul. 8, 2016

(65) Prior Publication Data

US 2017/0178992 A1 Jun. 22, 2017

(30) Foreign Application Priority Data

Dec. 21, 2015 (KR) .................. 10-2015-0183138

(51) Int. Cl.
*H01L 23/31* (2006.01)
*H01L 23/48* (2006.01)
(Continued)

(52) U.S. Cl.
CPC ........ *H01L 23/3157* (2013.01); *H01L 23/481* (2013.01); *H01L 23/562* (2013.01);
(Continued)

(58) Field of Classification Search
CPC ... H01L 23/3157; H01L 24/10; H01L 23/562; H01L 23/481; H01L 25/105; H01L 24/24;
(Continued)

(56) References Cited

U.S. PATENT DOCUMENTS 7,545,047 B2 * 6/2009 Bauer ................. H01L 21/6835
257/686
7,915,724 B2 3/2011 Ha et al.
(Continued)

FOREIGN PATENT DOCUMENTS

KR 10-2013-0132162 A 12/2013
KR 10-1362714 B1 2/2014
(Continued)

OTHER PUBLICATIONS

Korean Office Action issued in corresponding Korean Patent Application No. 10-2015-0183138, dated Apr. 17, 2018, with English Translation.

*Primary Examiner* — Nelson Garces
(74) *Attorney, Agent, or Firm* — Sughrue Mion, PLLC (57) ABSTRACT

An electronic component package includes a wiring part including an insulating layer, a conductive pattern formed on the insulating layer, and a conductive via connected to the conductive pattern through the insulating layer, an electronic component disposed on the wiring part, a frame disposed on the wiring part and having a component disposition region defined by an inner wall of the frame surrounding the electronic component, and an encapsulant filling at least a portion of the component disposition region. A portion of the inner wall of the frame forms a protrusion protruding toward the electronic component.

20 Claims, 10 Drawing Sheets

(51) Int. Cl.
*H01L 25/10* (2006.01)
*H01L 23/00* (2006.01)
*H01L 23/29* (2006.01)
*H01L 23/552* (2006.01)

(52) U.S. Cl.
CPC .............. *H01L 24/10* (2013.01); *H01L 24/20* (2013.01); *H01L 23/295* (2013.01); *H01L 23/3135* (2013.01); *H01L 23/552* (2013.01); *H01L 25/105* (2013.01); *H01L 2224/04105* (2013.01); *H01L 2224/12105* (2013.01); *H01L 2225/00* (2013.01); *H01L 2225/1035* (2013.01); *H01L 2225/1041* (2013.01); *H01L 2225/1058* (2013.01); *H01L 2924/1432* (2013.01); *H01L 2924/14335* (2013.01); *H01L 2924/1815* (2013.01); *H01L 2924/3025* (2013.01); *H01L 2924/3511* (2013.01); *H01L 2924/3512* (2013.01)

(58) Field of Classification Search
CPC ... H01L 23/49827; H01L 24/08; H01L 24/32; H01L 24/83; H01L 25/0655; H01L 23/3107; H01L 21/56; H01L 24/89; H01L 24/82; H01L 21/568; H01L 23/5389; H01L 24/19; H01L 2924/12042; H01L 2225/1041; H01L 2924/181; H01L 2224/04105; H01L 2224/12105; H01L 2225/107; H01L 2225/06548; H01L 2224/32235; H01L 2224/08235; H01L 2224/08111; H01L 2225/06572; H01L 2924/171; H01L 2224/24155; H01L 2224/24101; H01L 2924/18162; H01L 2225/1058; H01L 2225/1035; H01L 2225/00; H01L 2924/3511; H01L 2924/3025; H01L 2924/1815; H01L 2924/14335; H01L 2924/1432; H01L 23/552; H01L 23/3135; H01L 23/295; H01L 2924/3512; H01L 24/20
USPC .................................................. 257/680–790
See application file for complete search history.

(56) References Cited

U.S. PATENT DOCUMENTS

| | | | |
|---|---|---|---|
| 8,736,033 | B1 | 5/2014 | Chuo et al. |
| 2006/0234023 | A1* | 10/2006 | Endou ................ H01L 21/4807 428/210 |
| 2010/0025081 | A1* | 2/2010 | Arai .................... H01L 21/4857 174/251 |
| 2011/0164391 | A1* | 7/2011 | Shin ........................ H01L 23/13 361/761 |
| 2014/0070396 | A1 | 3/2014 | Kyozuka et al. |
| 2015/0187742 | A1* | 7/2015 | Kwon .................... H01L 24/82 257/774 |
| 2016/0071778 | A1* | 3/2016 | Otsubo ................ H01L 21/486 257/687 |

FOREIGN PATENT DOCUMENTS

| | | |
|---|---|---|
| KR | 10-1362715 B1 | 2/2014 |
| KR | 10-1368793 B1 | 3/2014 |
| KR | 10-2014-0054991 A | 5/2014 |

* cited by examiner

ELECTRONIC COMPONENT PACKAGE HAVING STRESS ALLEVIATION STRUCTURE

CROSS-REFERENCE TO RELATED APPLICATION

This application claims benefit of priority to Korean Patent Application No. 10-2015-0183138, filed on Dec. 21, 2015 with the Korean Intellectual Property Office, the disclosure of which is incorporated herein by reference.

TECHNICAL FIELD

The present disclosure relates to an electronic component package.

BACKGROUND

An electronic component package refers to package technology for electrically connecting an electronic component to a printed circuit board (PCB), such as a main board of an electronic device, and protecting the electronic component from external impacts. Recently, one major trend of technical development regarding electronic components is reducing a size of components, and in line with this, in a package field, realization of a plurality of pins with a reduced size is required to meet the rapid demand for miniaturized electronic components.

A wafer level package (WLP) using a redistribution line (RDL) of an electrode pad of an electronic component formed on a wafer has been proposed as a package technique to meet the aforementioned technical requirements. The WLP includes a fan-in WLP and a fan-out WLP, and in particular, the fan-out WLP, advantageous for realizing a plurality of pins with a reduced size, has been actively developed in recent years.

The present disclosure aims at providing an electronic component package in which concentration of stress or curving (or warpage) is significantly alleviated.

SUMMARY

An aspect of the present disclosure may provide an electronic component package having a compact structure and allowing for electrical inspection before an electronic component is mounted to thus significantly enhance manufacturing efficiency.

An aspect of the present disclosure may also provide a method of effectively manufacturing the aforementioned electronic component package.

According to an aspect of the present disclosure, an electronic component package may include: a wiring part including an insulating layer, a conductive pattern formed on the insulating layer, and a conductive via connected to the conductive pattern through the insulating layer; an electronic component disposed on the wiring part; a frame disposed on the wiring part and having a component disposition region formed by an inner wall of the frame surrounding the electronic component; and an encapsulant filling at least a portion of the component disposition region. A portion of the inner wall of the frame forms a protrusion protruding toward the electronic component.

The protrusion may have a different shape, and specifically, the protrusion may be formed by filling a trench or a through hole formed in a thickness direction of the frame with a material having rigidity lower than that of the frame.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower."

Electronic Device

Figure 1:
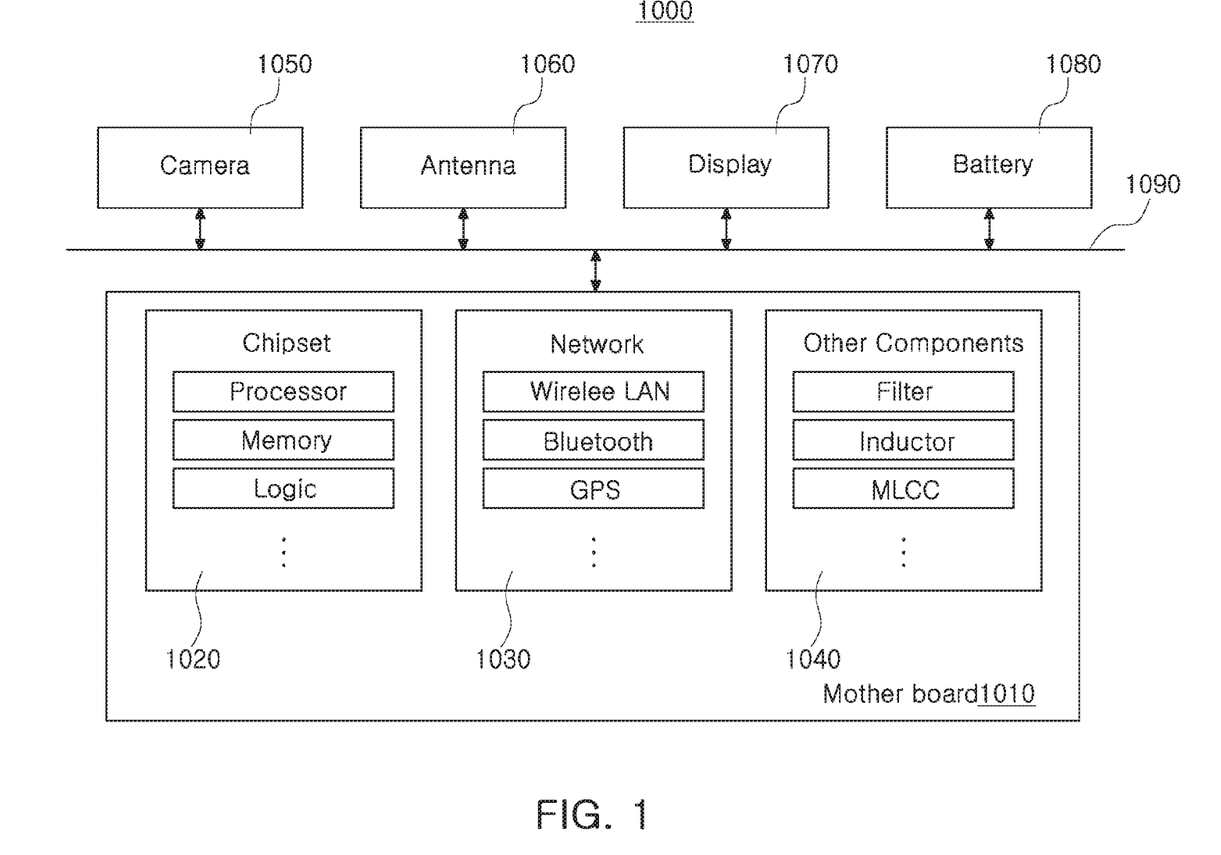
FIG. 1 is a block diagram schematically illustrating an example of an electronic device system according to an exemplary embodiment in the present disclosure.

FIG. 1 is a block diagram schematically illustrating an example of an electronic device system according to an exemplary embodiment in the present disclosure. Referring to FIG. 1, an electronic device 1000 includes a main board (or mother board) 1010. A chip-related component 1020, a network-related component 1030, and other components 1040 are physically and/or electrically connected to the main board 1010. These components are also coupled to other components as described hereinafter to form various signal lines 1090.

The chip-related component 1020 includes a memory chip such as a volatile memory (for example, a DRAM), a non-volatile memory (for example, a ROM), or a flash memory, an application processor chip such as a central processor (for example, a CPU), a graphics processor (for example, a GPU), a digital signal processor, a cryptography processor, a microprocessor, or a microcontroller, and a logic chip such as an analog-to-digital converter (ADC), or an application-specific integrated circuit (ASIC). However the chip-related component 1020 is not limited thereto, and may include any other types of chip-related components. Also, these components 1020 may be combined with each other.

The network-related component 1030 may include Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and certain other wireless/wired protocols designated thereafter. However, the network-related component 1030 is not limited thereto, and may include any other wireless or wired standards or protocols. Also, these components 1030 may be combined together with the aforementioned chip-related component 1020.

The other components 1040 include a high frequency (HF) inductor, a ferrite inductor, a power inductor, ferrite beads, low-temperature co-firing ceramics (LTCC), an electro-magnetic interference (EMI) filter, a multilayer ceramic condenser (MLCC), and the like. However, the other components 1040 are not limited thereto, and may include passive components, or the like, used for various other purposes. Also, these components 1040 may be combined together with the aforementioned chip-related component 1020 and/or the network-related component 1030.

The electronic device 1000 may include any other components that may be physically and/or electrically connected to the main board 1010 or not according to types of the electronic device 1000. These components may include a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (for example, a hard disk drive) (not shown), a compact disc (not shown), and a digital versatile disc (not shown). However, the any other components are not limited thereto, and may include other components used for various purposes according to types of the electronic device 1000.

The electronic device 1000 may be a smartphone, a personal digital assistant (PDA), a digital video camera, a digital still camera, a network system, a computer, a monitor, a tablet, a laptop computer, a netbook, a television, a video game console, or a smart watch. However, the electronic device 1000 is not limited thereto, and may be any other certain electronic device processing data.

Figure 2:
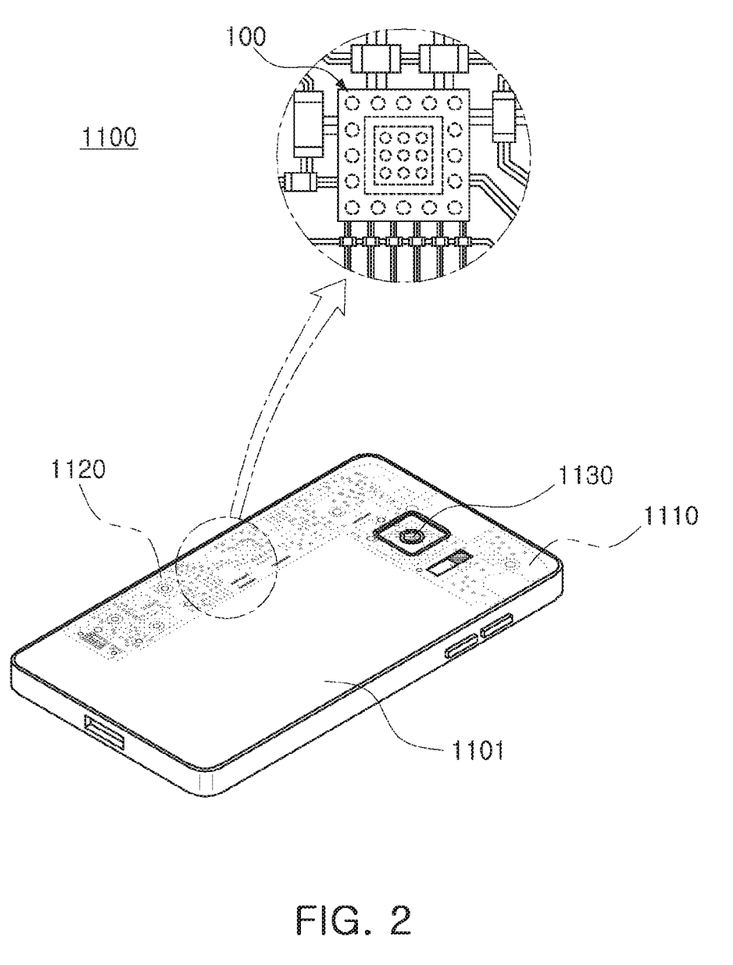
FIG. 2 is a view schematically illustrating an example of an electronic component package applied to an electronic device.

FIG. 2 is a view schematically illustrating an example of an electronic component package applied to an electronic device. The electronic component package is applied to various electronic devices 1000 for various purposes. For example, a main board 1110 is accommodated within a body 1101 of a smartphone 1100, and various electronic components 1120 are physically and/or electrically connected to the main board 1110. Also, another component that may be physically and/or electrically connected to the main board 1110, or not, such as a camera 1130, is accommodated within the body 1101. Here, some of the electronic components 1120 may be chip-related components as described above, and an electronic component package 100 may be an application processor, for example, but is not limited thereto.

Electronic Component Package

Figure 3:
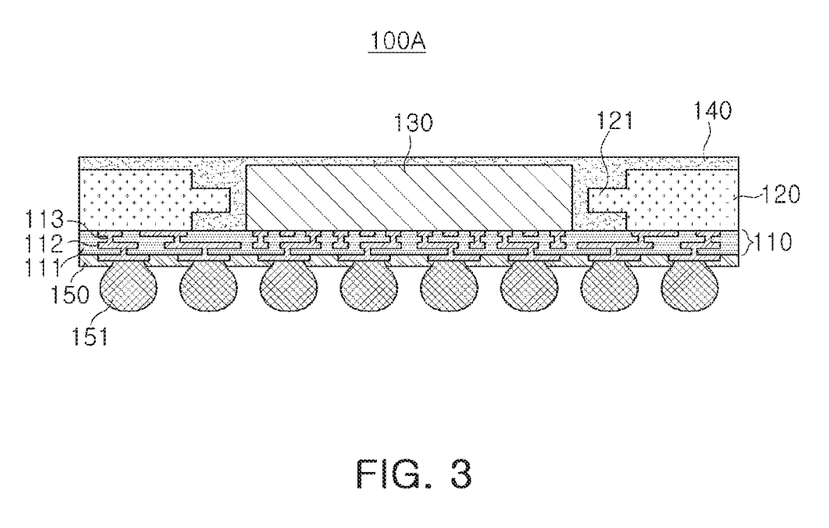
FIG. 3 is a cross-sectional view schematically illustrating an exemplary embodiment of an electronic component package.

FIG. 3 is a cross-sectional view schematically illustrating an exemplary embodiment of an electronic component package. An electronic component package 100A according to an exemplary embodiment may include a wiring part 110, a frame 120, an electronic component 130, and an encapsulant 140 as major components. A protrusion 121 is formed on the frame 120.

The wiring part 110 is provided as a mounting region of the electronic component 130 and electrically connected to the electronic component 130. The wiring part 110 includes an insulating layer 111, a conductive pattern 112, and a conductive via 113, and serves to re-distribute a wiring structure of the electronic component 130. In the example of FIG. 3, the wiring part 110 is illustrated as having a multilayer structure, but the wiring part 110 may be formed as a monolayer as necessary. Also, the wiring part 110 may have a larger amount of layers according to design particulars.

As an insulating material that may be included in the insulating layer 111, a thermosetting resin such as an epoxy resin, a thermoplastic resin such as polyimide, a resin obtained by impregnating the thermosetting resin or the thermoplastic resin with a stiffener such as glass fiber or an inorganic filler, such as pre-preg, Ajinomoto build-up film (ABF), FR-4, bismaleimide triazine (BT) resin, and the like, may be used. Also, in a case in which a photocurable material (PID) is used as an insulating material, the insulating layer 111 may be formed to be thinner and a micro-pattern therefore may be more easily realized. The insulating layers 111 forming respective layers of the wiring part 110 may be formed of the same material, or may be formed of different materials as necessary. A thickness of the insulating layer 111 is not limited. For example, a thickness of each layer, excluding a conductive pattern 112, may range from 5 μm to 20 μm, and may range from 15 μm to 70 μm with the conductive pattern 112 included.

The conductive pattern 112 may serve as a wiring pattern and/or a pad pattern, and may be formed of an electrically conductive material such as a copper (Cu), aluminum (Al), silver (Ag), tin (Sn), gold (Au), nickel (Ni), lead (Pd), or alloys thereof. The conductive pattern 112 may perform various functions according to a design of a corresponding layer. For example, the conductive pattern 112 may serve as a ground (GND) pattern, a power (PWR) pattern, or a signal (S) pattern, as a re-distribution pattern. Here, the signal (S) pattern includes various signals, such as a data signal, or the like, excluding the ground (GND) pattern and the power (PWR) pattern. Also, the conductive pattern 112 may serve as a via pad or an external connection terminal pad, as a pad pattern. A thickness of the conductive pattern 112 is not particularly limited, and may range from 10 µm to 50 µm, for example.

As illustrated in FIG. 3, the conductive pattern 112 may be embedded in the wiring part 110, and thus, a smaller micro-pattern may be realized. This, however, may not be essential in the present disclosure, and the conductive pattern 112 may be formed as a protrusion protruding from the surface of the insulating layer 111. A surface-treated layer may be formed on a portion of the conductive pattern 112 exposed to the outside of the insulating layer 111, for example, a portion thereof connected to the electronic component 130 as necessary. The surface-treated layer is not particularly limited as long as it is known in the art, and may be formed through electrolytic gold plating, electroless gold plating, electroless tin plating, electroless silver plating, or electroless nickel plating/immersion gold plating.

The conductive via 113 may electrically connect the conductive patterns 112, or the like, formed on different layers to each other, and as a result may form an electrical path within the package 100A. As a formation material of the conductive via 113, a conductive material such as copper (Cu), aluminum (Al), silver (Ag), tin (Sn), gold (Au), nickel (Ni), lead (Pd), or alloys thereof may also be used. The conductive via 113 may be completely filled with a conductive material, or a conductive material may be formed on a wall of the via. Also, the conductive via 113 may have any shape known in the art, such as a tapered shape in which a diameter thereof is decreased toward a lower surface thereof, a reverse tapered shape in which a diameter thereof is increased toward the lower surface thereof, and a cylindrical shape.

The frame 120, disposed on the wiring part 110 to support the package 110A, may maintain rigidity and secure thickness uniformity. The frame 120 has a component disposition region for disposing the electronic component 130. Such a component disposition region is defined by an inner wall surrounding the electronic component 130. As a specific example of the component disposition region, in the present exemplary embodiment, one or more through holes (one through hole in FIG. 3) penetrating through the frame 120 are used, and the electronic component 130 is positioned within the through hole. In this case, the component disposition region may be a trench, rather than a through hole.

A material used to form the frame 120 is not particularly limited, and a molding resin or pre-preg, preferably, a metal or a ceramic material, may be used. In this case, in order to alleviate warpage of the package 100A, the frame 120 may be formed of a material having relatively high rigidity. For example, the frame 120 may have rigidity higher than that of the encapsulant 140.

As described above, the protrusion 121 is formed on the frame 120, and as illustrated in FIG. 3, the protrusion 121 is formed as a portion of an inner wall of the frame 120 protrudes toward the electronic component 130. Also, a region surrounded by inner wall of the frame 120, not forming the protrusion 121, may be filled with a material having rigidity lower than that of the frame 120. In this case, as illustrated in FIG. 3, such a material may be the same as that of the encapsulant 140, and the encapsulant 140 may be in contact with the inner wall of the frame 120. The protrusion 121 may have a constant thickness and linearly protrude toward the electronic component 130. Alternatively, an upper surface and/or a lower surface of the protrusion 121 may have a slope different from each other, and at least one of the slopes of the upper surface and the lower surface may be different from that of the remaining portion of the inner wall not forming the protrusion 121. Here, each slope is defined to be an acute angle between a respective surface and a same reference surface, for example, a surface of the wiring part 110. An end surface of the protrusion 121 and the remaining portion of the inner wall not forming the protrusion 121 may be parallel to each other. The configuration in which a portion of the inner wall of the frame 120 protrudes may be obtained through various methods, such as a method of stacking a plurality of sheets having different widths or a method of appropriately processing the inner wall of the frame 120.

In the present exemplary embodiment, by employing the protrusion 121 in the frame 120, stress that may be concentrated on the periphery of the electronic component 130 may be reduced. That is, portions of the frame 120 (that is, portions above and below the protrusion 121) are filled with a material having relatively lower rigidity (a material forming the encapsulant in the present exemplary embodiment), and may serve as buffering portions within the package 100A. In this manner, since stress may be alleviated in an outer region of the electronic component 130 having a relatively significant difference in coefficient of thermal expansion, cracks are reduced and reliability of the package 100A may be enhanced.

Figure 4:
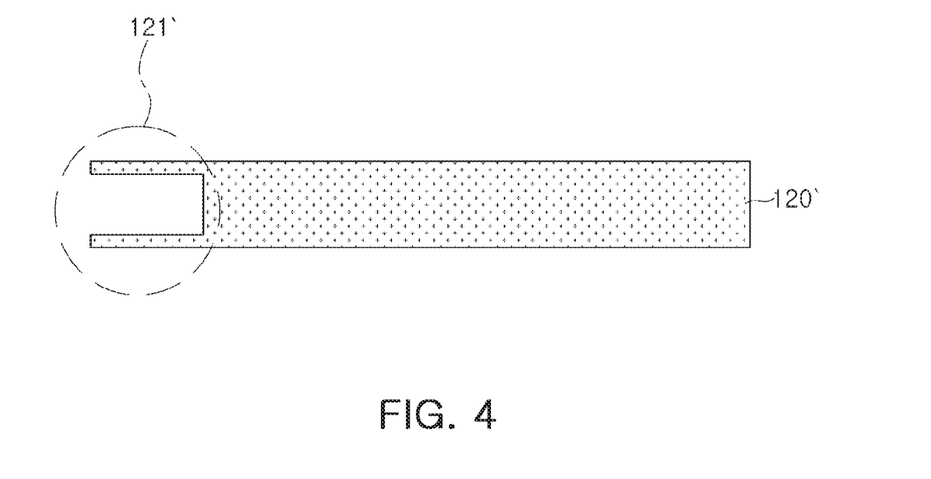
FIGS. 4 and 5 are views illustrating a modification of the exemplary embodiment of FIG. 3.

The protrusion 121 may not necessarily have such a shape as illustrated in FIG. 3. Similar to a frame 120' of a modified example of FIG. 4, a protrusion 121' may protrude from upper and lower regions, rather than from a central region, of the inner wall of the frame 120'. The modified example of the protrusion 121' may also be employed in exemplary embodiments described hereinafter. The present disclosure, however, is not limited thereto. Although not shown in the drawings, two or more protrusions may protrude from two or more selected from upper, central, and lower portions of the frame.

The electronic component 130 may be various active components (such as a diode, a vacuum tube, a transistor, etc.) or passive components (such as an inductor, a condenser, a resistor, etc.). Also, the electronic component 130 may be an integrated circuit (IC) chip as a single chip in which hundreds to millions or more elements are integrated. If necessary, the electronic component 130 may be an electronic component in which an IC is packaged as a flipchip. The IC chip may be an application processor chip such as a central processor (such as a CPU), a graphics processor (such as a GPU), a digital signal processor, a cryptography processor, a microprocessor, or a microcontroller, but is not limited thereto. Here, in FIG. 3, a configuration in which one electronic component 130 is mounted on the wiring part 110 is illustrated, but two or more components may also be used.

The encapsulant 140, which serves to protect the electronic component 130, fills a component disposition region of the frame 120. As illustrated in FIG. 3, the encapsulant 140 may be formed to fill at least a portion of the through hole of the frame 120, while covering the electronic component 130. Also, the encapsulant 140 may be formed to cover up to an upper surface of the frame 120. As described above, the encapsulant 140 may be formed around the protrusion 121 of the frame 120 to reduce concentration of stress. However, the encapsulant 140 may not necessarily be formed around the protrusion 121, and any other material having lower rigidity that of the frame 120 may be formed around the protrusion 121 instead.

A material used to form the encapsulant 140 is not particularly limited as long as the encapsulant 140 may perform the aforementioned functions. For example, the encapsulant 140 may be formed of a thermosetting resin such as an epoxy resin, a thermoplastic resin such as polyimide, a resin obtained by impregnating the thermosetting resin or the thermoplastic resin with a stiffener such as glass fiber or an inorganic filler, such as pre-preg, ABF, FR-4, BT, a PID resin, and the like. Alternatively, the encapsulant 140 may be obtained by stacking an uncured resin film on the wiring part 110 and the frame 120 and curing the resin film, and in addition to this method, the encapsulant 140 may be obtained using a known molding scheme such as EMC, or the like.

In order to block electromagnetic waves, the encapsulant 140 may include conductive particles as necessary. Any conductive particles may be formed of any material as long as the material is able to block electromagnetic waves. For example, the conductive particles may be formed of copper (Cu), aluminum (Al), silver (Ag), tin (Sn), gold (Au), nickel (Ni), lead (Pd), or solder, but is not limited thereto.

An external layer 150 may be formed below the wiring part 110 to protect the wiring part 110 from external physical and chemical influence. In this case, the external layer 150 may have an opening exposing at least a portion of the conductive pattern 112. A material of the external layer 150 is not particularly limited, and for example, solder resist may be used. In addition, the same material as that of the insulating layer 111 of the winding part 110 may be used. The external layer 150 may generally be a monolayer, and if necessary, it may be formed as a multilayer.

A connection terminal 151 may be provided at the lowermost portion of the electronic component package 100A. The connection terminal 151 is a component physically and/or electrically connecting the electronic component package 100A to the exterior. For example, the electronic component package 100A may be mounted on a main board of an electronic device through the connection terminal 151. The connection terminal 151 may be connected to the conductive pattern 112 through the opening formed in the external layer 150, and may also be electrically connected to the electronic component 130 through the conductive pattern 112 and the conductive via 113. The connection terminal 151 may be formed of, for example, a conductive material such as copper (Cu), aluminum (Al), silver (Ag), tin (Sn), gold (Au), nickel (Ni), lead (Pd), or solder, but a material of the connection terminal 151 is not limited thereto. The connection terminal 151 may be a land, a ball, or a pin. The connection terminal 151 may be formed as a multilayer or a monolayer. When the connection terminal 151 is formed as a multilayer, the connection terminal 151 may include a copper pillar and a solder, and when the connection terminal 151 is formed as a monolayer, the connection terminal 151 may include, for example, tin-silver solder or copper, but is not limited thereto.

A portion of the external connection terminal may be disposed in a fan-out region. The fan-out region refers to a region outside of a region in which an electronic component is disposed. That is, the electronic component package 100A according to an exemplary embodiment may be a fan-out package. The fan-out package may have excellent reliability, realize a plurality of I/O terminals, and be easy to make a 3D interconnection in comparison to a fan-in package. Also, compared with a ball grid array (BGA) package or a land grid array (LGA) package, the fan-out package may be able to be mounted on an electronic device without a separate board, which leads to a reduction in a thickness thereof and has excellent price competitiveness.

Figure 5:
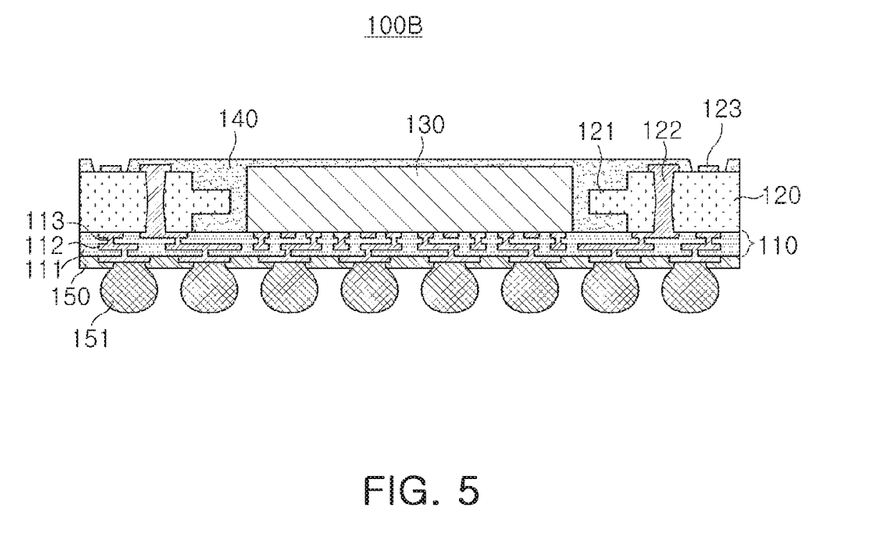

FIG. 5 is a view illustrating a modification of the exemplary embodiment of FIG. 3. In a package 100B illustrated in FIG. 5, a conductive via 122 penetrating through the frame 120 and serving as an electrically conductive structure of upper and lower portions may be formed in the frame 120. For example, the conductive via 122 of the frame 120 may be provided in such a manner that the conductive via 122 is connected to the conductive pattern 112 of the wiring part 110 and a conductive pattern 123 formed on an upper portion of the frame 120. The conductive via 122 may be formed by forming a hole in the frame 120 and filling the hole through a method such as plating, or the like, or may be formed as a conductive post. In this case, in order to be used in a package-on-package (POP) structure, or the like, as illustrated in FIG. 5, a partial region of the upper portion of the frame 120 may not be covered by the encapsulant 140, and the conductive pattern 123 may be formed in the corresponding region. Through this configuration, an additional electronic component may be mounted on the upper portion of the frame 120.

Figure 6:
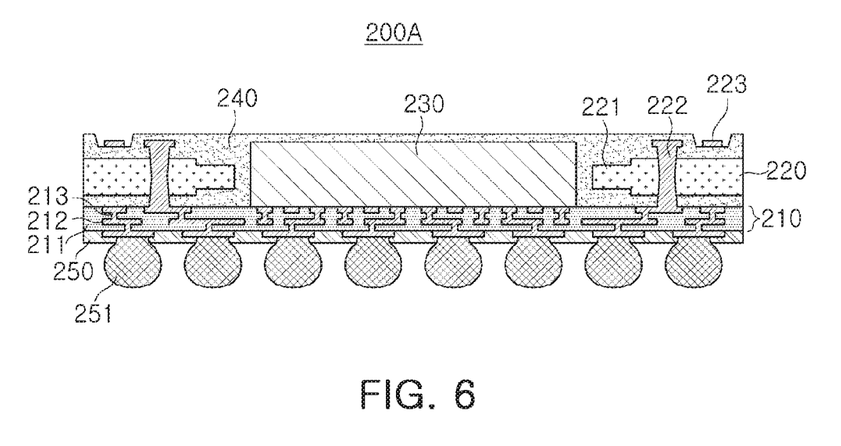
FIG. 6 is a cross-sectional view schematically illustrating another exemplary embodiment of an electronic component package.
Figure 7:
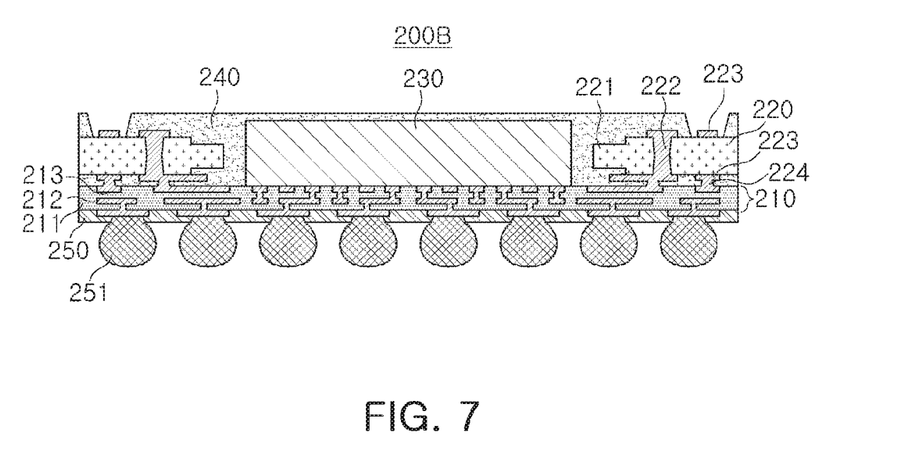
FIGS. 7 and 8 are views schematically illustrating a modified configuration of the electronic component package of FIG. 6.
Figure 8:
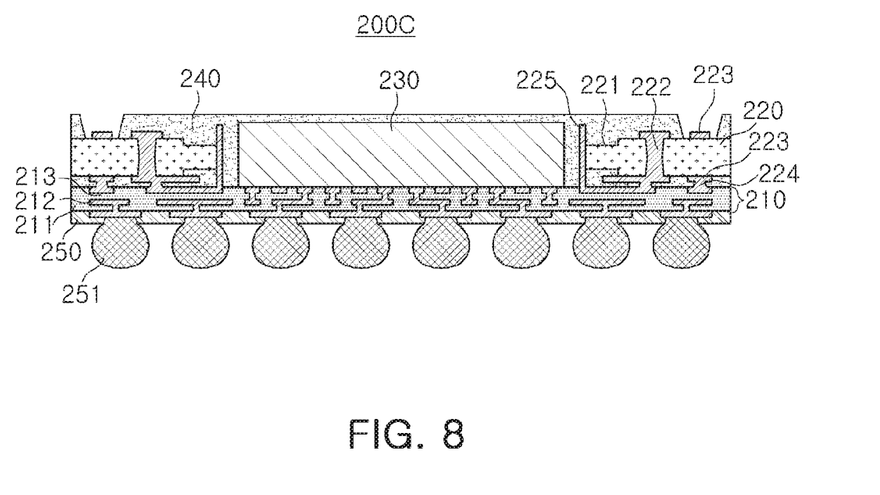

FIG. 6 is a cross-sectional view schematically illustrating another exemplary embodiment of an electronic component package. Also, FIGS. 7 and 8 are views schematically illustrating a modified configuration of the electronic component package 100B of FIG. 5. First, an electronic component package 200A according to an exemplary embodiment of FIG. 6 includes a wiring part 210, a frame 220, an electronic component 230, and an encapsulant 240 as major components. A protrusion 221 is formed in the frame 220, as in the previous example. Also, the wiring part 210 may include an insulating layer 211, a conductive pattern 212, and a conductive via 213. A conductive via 222 may be formed to penetrate through the frame 220, and a conductive pattern 223 may be formed in an upper portion of the frame 220. In addition, an external layer 250 may be formed on a lower surface of the wiring part 210, and a connection terminal 251 may be provided in the lowermost portion of the package 200A.

In the present exemplary embodiment, a space between the frame 220 and the wiring part 210 is filled with an insulating material, and such an insulating material may be the same as a material of the encapsulant 240 as illustrated in FIG. 6. Alternatively, the insulating material may be different from the material of the encapsulant 240, and, for example, it may be obtained using a method of stacking a sheet formed of a material different from that of the frame 220 together with the frame 220.

An additional conductive pattern 223 and a conductive via 224 may be disposed in the insulating material formed below the frame 220, as in a package 200B according to a modified example of FIG. 7. The conductive pattern 223 and a conductive via 224 may be electrically connected to the wiring part 210 and may perform an additional redistribution line function, for example. A size of the wiring part 210 may be reduced through the additional redistribution line function.

A package 200C according to another modified example illustrated in FIG. 8 further includes a conductive pattern 225 disposed on an inner wall of the frame 220. The conductive pattern 225 may be connected to the conductive patterns 212 and 223 below the wiring part 210 or the frame 220. Here, the conductive pattern 225 may perform a function of shielding against electromagnetic waves, and to this end, the conductive pattern 225 may be connected to a ground terminal.

Figure 9:
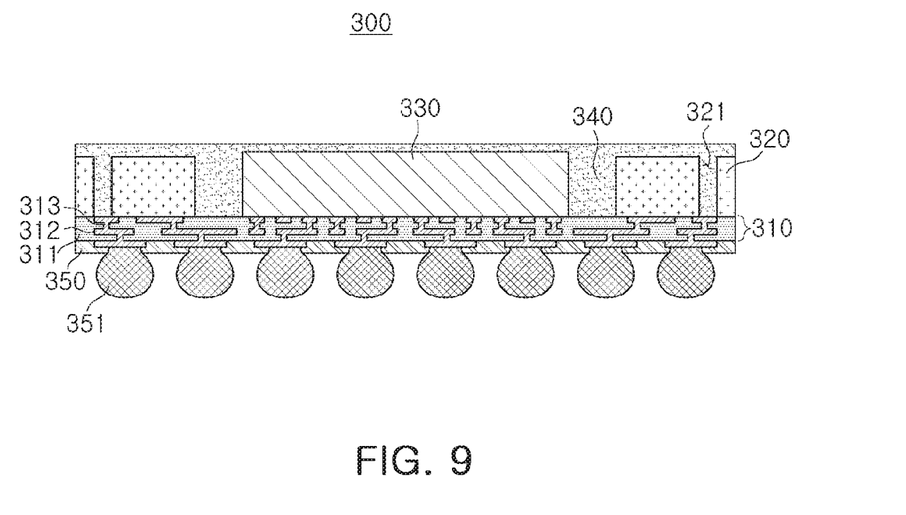
FIG. 9 is a cross-sectional view schematically illustrating another exemplary embodiment of an electronic component package.
Figure 10:
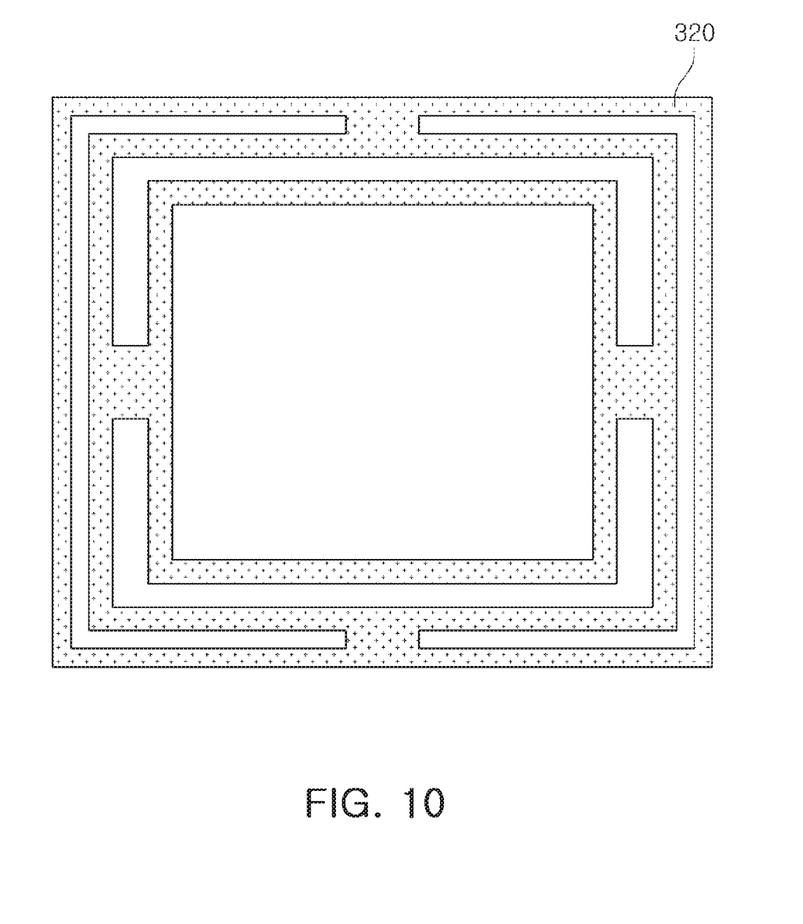
FIG. 10 is a plan view schematically illustrating a configuration of a frame that may be employed in the exemplary embodiment of FIG. 9.

FIG. 9 is a cross-sectional view schematically illustrating another exemplary embodiment of an electronic component package, and FIG. 10 is a plan view schematically illustrating a configuration of a frame that may be employed in the exemplary embodiment of FIG. 9. Referring to FIGS. 9 and 10, an electronic component package 300 may include a wiring part 310, a frame 320, an electronic component 330, and an encapsulant 340 as major components, as in the previous example. The electronic component package 300 is different from the previous example in regard to a specific configuration of a stress alleviation structure formed in the frame 320. Also, the wiring part 310 may include an insulating layer 311, a conductive pattern 312, and a conductive via 313, and an external layer 350 and a connection terminal 351 may be provided below the wiring part 310.

In the present exemplary embodiment, a through hole may be formed in a thickness direction in the frame 320, and the stress alleviation structure may be formed as a region 321 by filling the through hole with a material having rigidity lower than that of the frame 320. Here, although not illustrated in FIG. 9, the region 321 may have a shape such as a trench, rather than completely penetrating through the frame 320. The region 321 may be formed of the same material, which has rigidity lower than that of the frame 320, as that of the encapsulant 340. Alternatively, the region 321 may be filled with a material different from that of the encapsulant 340 and having rigidity lower than that of the frame 320.

The stress alleviation structure illustrated in FIG. 9 may be used as is, or may be used together with the protrusion of the frame described above.

A configuration illustrated in FIG. 10 is designed in the aspect of reducing stress of the package 300, as an example of a through hole formed in the frame 320. Similar to the structures described above, stress concentrating on the periphery of the electronic component 330 may be effectively reduced by filling the through hole or trench of the frame 320 with a low rigidity material, such as the same material as that of the encapsulant 340. Meanwhile, although not shown, a conductive via may be formed to penetrate through the frame 320 to realize an electrical connection structure of upper and lower portions, as in the previous exemplary embodiment.

As set forth above, the use of the electronic component package proposed in the exemplary embodiments in the present disclosure may significantly reduce an influence (occurrence of cracks due to warpage or concentration of stress) due to a difference in coefficients of thermal expansion between heterogeneous materials when a package is manufactured or used.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a wiring part including an insulating layer, a conductive pattern formed on the insulating layer, and a conductive via connected to the conductive pattern through the insulating layer;
   a semiconductor chip disposed on the wiring part;
   a frame disposed on the wiring part, having upper and lower surfaces opposing each other, and including a component disposition region defined by an inner wall of the frame surrounding the semiconductor chip; and
   an encapsulant filling at least a portion of the component disposition region,
   wherein a portion of the inner wall of the frame has first and second protrusions, made of an insulating material and disposed on opposite sides of the semiconductor chip, protruding toward the semiconductor chip,
   each of the first and second protrusions has an upper surface, a lower surface opposing the upper surface, and an end surface connecting the upper and lower surfaces of a respective one of the first and second protrusions and opposing the inner wall of the frame, the semiconductor chip disposed between the end surfaces of the first and second protrusions,
   the upper surface of the frame and the upper surface of each of the first and second protrusions have a first step, and the lower surface of the frame and the lower surface of each of the first and second protrusions have a second step,
   the encapsulant extends continuously from the upper surface of the frame to the second step and passes the first step, a space between the first protrusion and the semiconductor chip, and a space between the second protrusion and the semiconductor chip, and
   no electrically conductive pattern is disposed directly on the upper surface or the lower surface of each of the first and second protrusions to be electrically connected to the semiconductor chip.

2. The semiconductor package of claim 1, wherein a region surrounded by the inner wall of the frame in which the first and second protrusions are not formed is filled with a material having rigidity lower than that of the frame.

3. The semiconductor package of claim 2, wherein the material having rigidity lower than that of the frame is the same as that of the encapsulant.

4. The semiconductor package of claim 1, wherein the encapsulant has rigidity lower than that of the frame.

5. The semiconductor package of claim 1, wherein the encapsulant is in contact with the inner wall of the frame.

6. The semiconductor package of claim 1, wherein the component disposition region has a form of a through hole penetrating through the frame.

7. The semiconductor package of claim 1, further comprising a conductive via penetrating through the frame.

8. The semiconductor package of claim 1, wherein the encapsulant covers the frame.

9. The semiconductor package of claim 8, wherein the encapsulant has an opening exposing a partial region of an upper surface of the frame.

10. The semiconductor package of claim 9, wherein a conductive pattern is formed on the partial region of the upper surface of the frame and is exposed by the encapsulant.

11. The semiconductor package of claim 1, wherein a space between the frame and the wiring part is filled with an insulating material.

12. The semiconductor package of claim 11, further comprising a conductive pattern and a conductive via disposed between the frame and the wiring part and electrically connected to the wiring part.

13. The semiconductor package of claim 1, further comprising a conductive pattern disposed on the inner wall of the frame.

14. The semiconductor package of claim 1, wherein each of the first and second protrusions linearly protrudes toward the semiconductor chip.

15. The semiconductor package of claim 1, the encapsulant is in contact with the upper and lower surfaces of each of the first and second protrusions.

16. The semiconductor package of claim 15, wherein the encapsulant is in contact with the end surface of each of the first and second protrusions.

17. The semiconductor package of claim 15, further comprising a conductive pattern disposed on the end surface of each of the first and second protrusions.

18. The semiconductor package of claim 1, wherein the frame is made of an electrically insulating material.

19. A semiconductor package comprising:
- a wiring part including an insulating layer, a conductive pattern formed on the insulating layer, and a conductive via connected to the conductive pattern through the insulating layer;
- a semiconductor chip disposed on the wiring part;
- a frame disposed on the wiring part and having a component disposition region defined by an inner wall of the frame surrounding the semiconductor chip; and
- an encapsulant filling at least a portion of the component disposition region,
- wherein a portion of the inner wall of the frame has first and second protrusions protruding toward the semiconductor chip and a recess between the first and second protrusions.

20. The semiconductor package of claim 19, wherein an upper surface of the frame and an upper surface of the first protrusion are coplanar with each other, and a lower surface of the frame and a lower surface of the second protrusion are coplanar with each other.

* * * * *